United States Patent
Zhang et al.

(10) Patent No.: US 9,819,333 B2
(45) Date of Patent: Nov. 14, 2017

(54) CIRCUIT FOR DECREASING AN ELECTROMAGNETIC INTERFERENCE OF A PWM PULSE MODULATION SIGNAL

(71) Applicant: Shenzhen China Star Optoelectronics Technology Co., Ltd., Shenzhen, Guagdong (CN)

(72) Inventors: Xianming Zhang, Guangdong (CN); Dan Cao, Guangdong (CN)

(73) Assignee: Shenzhen China Star Optoelectronics Technology Co., Ltd, Shenzhen (CN)

( * ) Notice: Subject to any disclaimer, the term of this patent is extended or adjusted under 35 U.S.C. 154(b) by 116 days.

(21) Appl. No.: 14/904,863

(22) PCT Filed: Sep. 11, 2015

(86) PCT No.: PCT/CN2015/089466
§ 371 (c)(1),
(2) Date: Jan. 13, 2016

(87) PCT Pub. No.: WO2017/024656
PCT Pub. Date: Feb. 16, 2017

(65) Prior Publication Data
US 2017/0222636 A1    Aug. 3, 2017

(30) Foreign Application Priority Data

Aug. 12, 2015 (CN) .......................... 2015 1 0492764

(51) Int. Cl.
*H03K 5/1252* (2006.01)
(52) U.S. Cl.
CPC .................. *H03K 5/1252* (2013.01)

(58) Field of Classification Search
CPC ..................................................... H03K 5/1252
(Continued)

(56) References Cited

U.S. PATENT DOCUMENTS

| 2012/0194227 A1 | 8/2012 | Lin | |
|---|---|---|---|
| 2012/0217984 A1* | 8/2012 | Yu | G01D 5/246 |
| | | | 324/710 |
| 2013/0241627 A1 | 9/2013 | Gao | |

FOREIGN PATENT DOCUMENTS

| CN | 1767304 A | 5/2006 |
|---|---|---|
| CN | 1905343 A | 1/2007 |

(Continued)

*Primary Examiner* — William Hernandez
(74) *Attorney, Agent, or Firm* — Andrew C. Cheng

(57) ABSTRACT

A circuit of decreasing an electromagnetic interference of PWM pulse modulation signal has: a load detecting circuit used to output a mode detection signal to a control circuit according to a current generated by a load when the load connected to the load detecting circuit is detected; the control circuit connected to the load detecting circuit and outputting a voltage control signal to a resistance-adjustment circuit according to the mode detection signal; the resistance-adjustment circuit connected to the control circuit, adjusting a resistance of a driving resistor of the resistance-adjustment circuit and further adjusting a driving frequency of a pulse generating circuit; and the pulse generating circuit connected to the resistance-adjustment circuit and outputting a PWM pulse modulation signal according to the adjusted driving frequency. Under the heavy loading mode, the driving frequency of the PWM pulse modulation signal is adjusted so the electromagnetic interference is decreased effectively.

10 Claims, 2 Drawing Sheets

(58) Field of Classification Search
USPC .................................. 327/172, 175, 176, 551
See application file for complete search history.

(56) References Cited

FOREIGN PATENT DOCUMENTS

| | | |
|---|---|---|
| CN | 102655375 | 9/2012 |
| CN | 103036447 A | 4/2013 |
| CN | 103904899 A | 7/2014 |

\* cited by examiner

CIRCUIT FOR DECREASING AN ELECTROMAGNETIC INTERFERENCE OF A PWM PULSE MODULATION SIGNAL

CROSS-REFERENCE TO RELATED APPLICATIONS

This application claims the priority of Chinese Patent Application No. 201510492764.1, entitled "circuit of decreasing an electromagnetic interference of PWM pulse modulation signal", filed on Aug. 12, 2015, the disclosure of which is incorporated herein by reference in its entirety.

FIELD OF THE INVENTION

The present invention relates to an electronic technology field, and more particularly to a circuit for decreasing an electromagnetic interference of a PWM pulse modulation signal.

BACKGROUND OF THE INVENTION

With the continuous increase in switching frequency of the switching power of the pulse width modulation (PWM) technology, it causes a generation of an electromagnetic interference. The electromagnetic interference peak values of the switching transformer concentrate on frequency-multiplication points of the switching frequency. Since it is a discrete spectrum which uses the switching frequency as a basis frequency, those harmonic components are transmitted outwardly by transmitting lines and a space electromagnetic field and transmission and radiation interference issues are generated accordingly. It not only seriously pollutes the surrounding electromagnetic environment, but also causes the electromagnetic interference to nearby electrical equipment. In a conventional technology solution, in order to decrease the electromagnetic interference of the switching transformer, it usually employs a small amount of resistors, capacitors and some integrated operational amplifying elements to implement. Furthermore, PWM integrated circuit employs fixed modes, which are not able to be adjusted according to the variations of heavy and light loadings. Under a heavy loading condition, a serious electromagnetic interference is generated since a larger current change and a larger change of a voltage ripple.

SUMMARY OF THE INVENTION

The embodiment of the present invention provides a circuit of decreasing an electromagnetic interference of PWM pulse modulation signal. it can adjust a driving frequency of a PWM pulse modulation signal under a heavy loading mode, so an electromagnetic interference is decreased effectively.

The embodiment of the present invention provides the circuit of decreasing an electromagnetic interference of PWM pulse modulation signal and the circuit comprises a load detecting circuit, a control circuit, a resistance-adjustment circuit and a pulse generating circuit, wherein:

the load detecting circuit is used to output a mode detection signal to the control circuit according to a current generated by a load when the load connected to the load detecting circuit is detected;

the control circuit is connected to the load detecting circuit and outputs a voltage control signal to the resistance-adjustment circuit according to the mode detection signal;

the resistance-adjustment circuit is connected to the control circuit, adjusts a resistance of a driving resistor of the resistance-adjustment circuit and further adjusts a driving frequency of the pulse generating circuit; and the pulse generating circuit is connected to the resistance-adjustment circuit and outputs a PWM pulse modulation signal according to the adjusted driving frequency.

Selectively, the control circuit is particularly used for: if the mode detection signal is a high voltage level, the circuit is ensured to be at a heavy loading condition and further outputs the voltage control signal to the resistance-adjustment circuit.

Selectively, the resistance-adjustment circuit comprises a first resistor, a first switch and at least one resistance control unit, wherein:

an end of the resistor is connected to an input terminal of the pulse generating circuit, the other end of the resistor is connected to a first end of the resistance control unit, a second end of the resistance control unit is connected to a first control terminal of the control circuit, a third end of the resistance control unit is connected to a first pin of the first switch, a second pin of the first switch is connected to a second control terminal of the control circuit, and a third pin of the first switch is connected to the ground.

Selectively, the resistance control unit comprises a second switch and a second resistor, wherein:

a first pin of the second switch and an end of the second resistor are respectively connected to the first end of the resistance control unit, a second pin of the second switch and the other end of the second resistor are respectively connected to the third end of the resistance control unit, and a third pin of the second switch is connected to the second end of the resistance control unit.

Selectively, the at least one resistance control unit is combined to a first series-connection control assembly and a second series-connection control assembly, and the first series-connection control assembly and the second series-connection control assembly are connected in parallel.

Selectively, the load detecting circuit comprises a third resistor and an operational amplifier, wherein:

an end of the third resistor is connected to a first input terminal of the operational amplifier, the other end of the third resistor is connected to a second input terminal of the operational amplifier, and an output terminal of the operational amplifier is connected to an input terminal of the control circuit.

Selectively, the operational amplifier is a subtracter.

Selectively, the switch comprises a MOSFET or a transistor.

To implement the embodiment of the present invention, when the load detecting circuit firstly detects that the load is connected to the load detecting circuit, a mode detection signal is outputted to the control circuit according to the current generated by the load. And then the control circuit outputs the voltage control signal to the resistance-adjustment circuit according to the mode detection signal. Secondary, the resistance-adjustment circuit adjusts the resistance of the driving resistor therein according to the voltage control signal and further adjusts the driving frequency of the pulse generating circuit. Finally, the pulse generating circuit outputs the PWM pulse modulation signal according to the adjusted driving frequency. Under the heavy loading mode, the driving frequency of the PWM pulse modulation signal is adjusted so the electromagnetic interference is decreased effectively.

BRIEF DESCRIPTION OF THE DRAWINGS

In order to more clearly illustrate the embodiments of the present invention or prior art, the following figures will be described in the embodiments are briefly introduced.

DETAILED DESCRIPTION OF THE PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
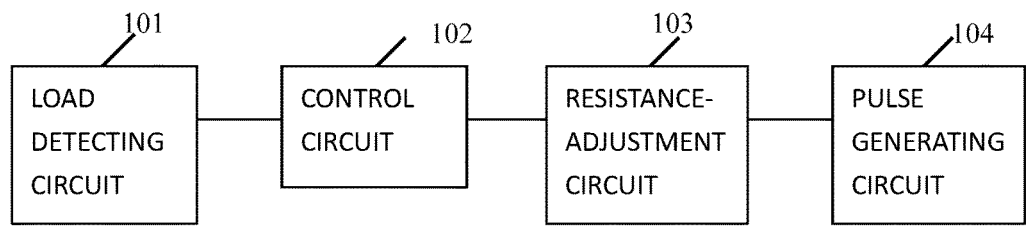
FIG. 1 is a structural schematic diagram of a circuit of decreasing an electromagnetic interference of PWM pulse modulation signal of a first embodiment provided by the present invention.

Please refer to FIG. 1. FIG. 1 is a structural schematic diagram of a circuit of decreasing an electromagnetic interference of PWM pulse modulation signal of a first embodiment provided by the present invention. As shown in the drawing, the circuit of the embodiment of present invention comprises:

A load detecting circuit 101 is used to output a mode detection signal to a control circuit according to a current generated by a load when the load connected to the load detecting circuit is detected.

Figure 2:
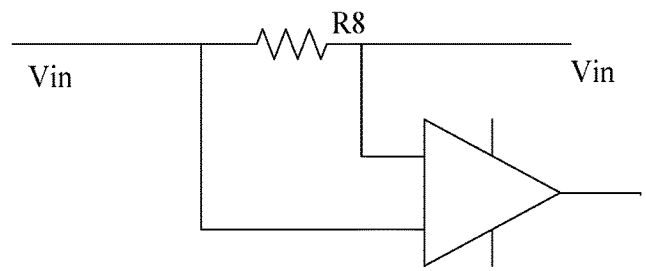
FIG. 2 is a structural schematic diagram of a load detecting circuit provided by an embodiment of the present invention.

Particularly, as shown in FIG. 2, the load detecting circuit 101 comprises a third resistor R8 and an operational amplifier. An end of the third resistor is connected to a first input terminal of the operational amplifier. The other end of the third resistor is connected to a second input terminal of the operational amplifier. An output terminal of the operational amplifier is connected to an input terminal of the control circuit, wherein the operational amplifier is a subtracter.

The control circuit 102 is connected to the load detecting circuit 101 and outputs a voltage control signal to a resistance-adjustment circuit according to the mode detection signal, wherein the control circuit 102 may comprise a microprocessor.

Particularly, if the mode detection signal is a high voltage level, the circuit is ensured to be at the heavy loading condition and the voltage control signal is further outputted to the resistance-adjustment circuit. Wherein, the voltage control signal may be a high and low voltage-level signal and each of multiple control terminals of the microprocessor may output different voltage-level signals to control a switch of the resistance-adjustment circuit 103 to turn on or off.

The resistance-adjustment circuit 103 is connected to the control circuit 102 and adjusts a resistance of a driving resistor of the resistance-adjustment circuit according to the voltage control signal and further adjusts a driving frequency of a pulse generating circuit. Wherein, the resistance-adjustment circuit 103 comprises at least one resistance control unit. Each resistance control unit comprises a resistor and a switch.

The pulse generating circuit 104 is connected to the resistance-adjustment circuit 103 and outputs a PWM pulse modulation signal according to the adjusted driving frequency.

It should be noted that when the load connected to the two ends of the resistor R8 is detected, a current is generated to flow through the resistor R8 and a voltage drop is formed between the two ends of the resistor R8. If the voltage drop is not greater than a preset voltage, the mode detection signal outputted from the subtracter is a low voltage level. If the voltage drop is greater than the preset voltage, the mode detection signal outputted from the subtracter is a high voltage level. After the control circuit 102 received the high voltage level, the control circuit 102 starts to output the voltage control signal. The voltage control signal can control the switch to turn on to adjust the resistance of the resistance-adjustment circuit 103 and to further adjust the driving frequency of the pulse generating circuit. The pulse generating circuit 104 outputs the PWM pulse modulation signal according to the adjusted driving frequency to decrease the electromagnetic interference.

In the embodiment of the present invention, firstly, when the load detecting circuit detects that the load is connected to the load detecting circuit, the mode detection signal is outputted to the control circuit according to the current generated by the load. And then the control circuit outputs the voltage control signal to the resistance-adjustment circuit according to the mode detection signal. Secondary, the resistance-adjustment circuit adjusts the resistance of the driving resistor of the resistance-adjustment circuit according to the voltage control signal and further adjusts the driving frequency of the pulse generating circuit. Finally, the pulse generating circuit outputs the PWM pulse modulation signal according to the adjusted driving frequency. Under the heavy loading mode, the driving frequency of the PWM pulse modulation signal is adjusted so the electromagnetic interference is decreased effectively.

Figure 3:
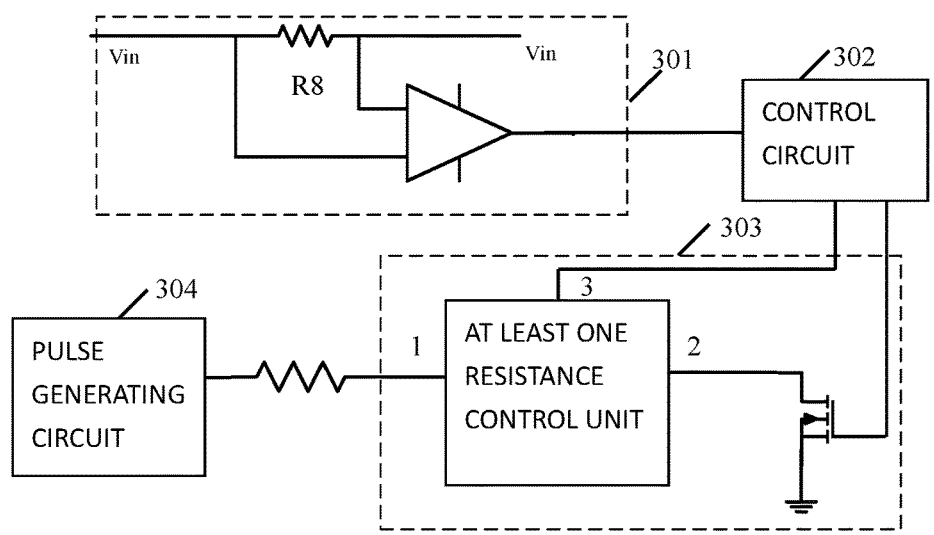
FIG. 3 is a structural schematic diagram of a circuit of decreasing an electromagnetic interference of PWM pulse modulation signal of a second embodiment provided by the present invention.

Please refer to FIG. 3. FIG. 3 is a structural schematic diagram of a circuit of decreasing an electromagnetic interference of PWM pulse modulation signal of a second embodiment provided by the present invention. As shown in the drawing, the circuit of the embodiment of the present invention comprises:

A load detecting circuit 301 is used to output the mode detection signal to a control circuit according to the current generated by the load when the load connected to the load detecting circuit is detected.

Particularly, as shown in FIG. 2, the load detecting circuit 301 comprises a third resistor and an operational amplifier. An end of the third resistor is connected to a first input terminal of the operational amplifier. The other end of the third resistor is connected to a second input terminal of the operational amplifier. An output terminal of the operational amplifier is connected to an input terminal of the control circuit, wherein the operational amplifier is a subtracter.

The control circuit 302 is connected to the load detecting circuit 301 and outputs the voltage control signal to a resistance-adjustment circuit according to the mode detection signal, wherein the control circuit 302 may comprise a microprocessor.

Particularly, if the mode detection signal is a high voltage level, the circuit is ensured to be at a heavy loading condition and the voltage control signal is further outputted to the resistance-adjustment circuit. Wherein, the voltage control signal may be a high and low voltage-level signal and each of multiple control terminals of the microprocessor may output different voltage-level signals to control switch of the resistance-adjustment circuit 303 to turn on or off.

The resistance-adjustment circuit 303 is connected to the control circuit 302 and adjusts a resistance of a driving resistor of the resistance-adjustment circuit according to the voltage control signal and further adjusts a driving frequency of a pulse generating circuit.

Particularly, the resistance-adjustment circuit 303 comprises a first resistor, a first switch and at least one resistance control unit, wherein: an end of the first resistor is connected to an input terminal of the pulse generating circuit and the other end of the first resistor is connected to a first end of the resistance control unit. A second end of the resistance control unit is connected to a first control terminal of the control circuit. A third end of the resistance control unit is connected to a first pin of the first switch, a second pin of the first switch is connected to a second control terminal of the control circuit, and a third pin of the first switch is connected to the ground, wherein the switch can comprise a MOSFET or a transistor.

Furthermore, the resistance control unit comprises a second and a second resistor, wherein: a first pin of the second switch and one end of the second resistor are respectively connected to the first end of the resistance control unit, a second pin of the second switch and the other end of the second resistor are respectively connected to the third end of the resistance control unit, and a third pin of the second switch is connected to the second end of the resistance control unit.

It should be noted that the first switch can be at a turn-on condition according to the voltage control signal outputted from the control circuit 302. When the second switch is at the turn-off condition according to the voltage control signal outputted from the control circuit 302, the first resistor is connected to the second resistor in serial and the resistance of the resistance-adjustment circuit 303 is a sum of resistances of the first and second resistors. When the second switch is at the turn-on condition according to the voltage control signal outputted from the control circuit 302, the second resistor is shorted and the resistance of the resistance-adjustment circuit 303 is the resistance of the first resistor.

The pulse generating circuit 304 is connected to the resistance-adjustment circuit 303 and outputs the PWM pulse modulation signal according to the adjusted driving frequency.

It should be noted that when the load connected to the two ends of the resistor R8 is detected, a current is generated to flow through the resistor R8 and a voltage drop is formed between the two ends of the resistor R8. If the voltage drop is not greater than a preset voltage, the mode detection signal outputted from the subtracter is the low voltage level. If the voltage drop is greater than the preset voltage, the mode detection signal outputted from the subtracter is the high voltage level. After the control circuit 302 received the high voltage level, the control circuit 302 starts to output the voltage control signal. The voltage control signal can control the switch to turn on to adjust the resistance of the resistance-adjustment circuit 303 and to further adjust the driving frequency of the pulse generating circuit. The pulse generating circuit 304 outputs the PWM pulse modulation signal according to the adjusted driving frequency to decrease the electromagnetic interference.

In the embodiment of the present invention, firstly, when the load detecting circuit detects that the load is connected to the load detecting circuit, the mode detection signal is outputted to the control circuit according to the current generated by the load. And then the control circuit outputs the voltage control signal to the resistance-adjustment circuit according to the mode detection signal. Secondary, the resistance-adjustment circuit adjusts the resistance of the driving resistor in the resistance-adjustment circuit according to the voltage control signal and further adjusts the driving frequency of the pulse generating circuit. Finally, the pulse generating circuit outputs the PWM pulse modulation signal according to the adjusted driving frequency. Under the heavy loading mode, the driving frequency of the PWM pulse modulation signal is adjusted so the electromagnetic interference is decreased effectively.

Figure 4:
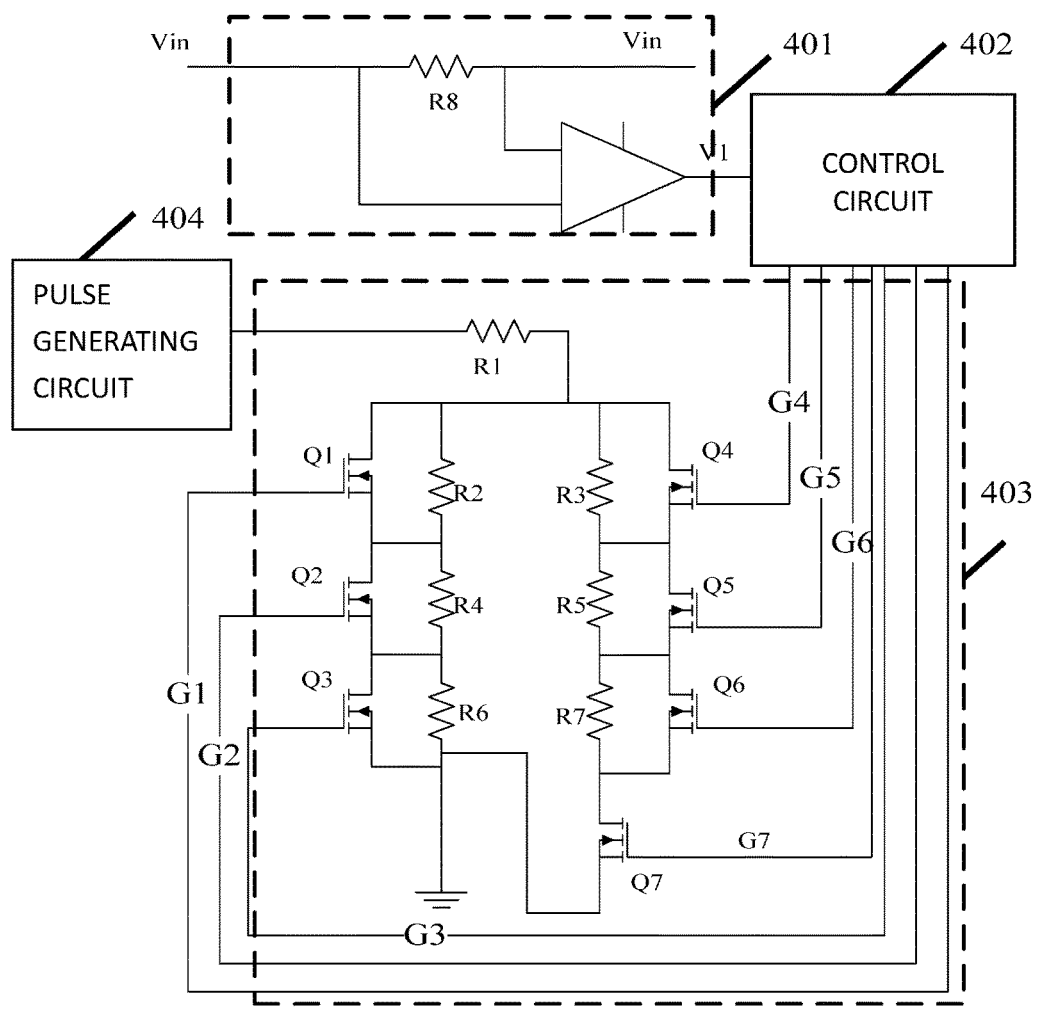
FIG. 4 is a structural schematic diagram of a circuit of decreasing an electromagnetic interference of PWM pulse modulation signal of a third embodiment provided by the present invention.

Please refer to FIG. 4. FIG. 4 is a structural schematic diagram of a circuit of decreasing an electromagnetic interference of PWM pulse modulation signal of a third embodiment provided by the present invention. As shown in the drawing, the circuit of the embodiment of the present invention comprises:

A load detecting circuit 401 is used to output the mode detection signal to a control circuit according to the current generated by a load when the load connected to the load detecting circuit is detected.

Particularly, as shown in FIG. 2, the load detecting circuit 401 comprises a third resistor and an operational amplifier. An end of the third resistor is connected to a first input terminal of the operational amplifier. The other end of the third resistor is connected to a second input terminal of the operational amplifier. An output terminal of the operational amplifier is connected to an input terminal of the control circuit, wherein the operational amplifier is a subtracter.

The control circuit 402 is connected to the load detecting circuit 401 and outputs the voltage control signal to a resistance-adjustment circuit according to the mode detection signal, wherein the control circuit 402 may comprise a microprocessor.

Particularly, if the mode detection signal is a high voltage level, the circuit is ensured to be at a heavy loading condition and the voltage control signal if further outputted to the resistance-adjustment circuit. Wherein, the voltage control signal may be a high and low voltage-level signal and each of multiple control terminals of the microprocessor may output different voltage-level signals to control switch of the resistance-adjustment circuit 403 to turn on or off.

The resistance-adjustment circuit 403 is connected to the control circuit 402 and adjusts a resistance of a driving resistor of the resistance-adjustment circuit according to the voltage control signal and further adjusts a driving frequency of a pulse generating circuit.

Particularly, the resistance-adjustment circuit 403 comprises a first resistor, a first switch and at least one resistance control unit, wherein an end of the first resistor is connected to an input terminal of the pulse generating circuit and the other end of the first resistor is connected to a first end of the resistance control unit. A second end of the resistance control unit is connected to a first control terminal of the control circuit. A third end of the resistance control unit is connected to a first pin of the first switch, a second pin of the first switch is connected to a second control terminal of the control circuit, and a third pin of the first switch is connected to the ground, wherein the switch can comprise a MOSFET or a transistor.

Furthermore, the resistance control unit comprises a second and a second resistor, wherein: a first pin of the second switch and one end of the second resistor are respectively connected to the first end of the resistance control unit, a second pin of the second switch and the other end of the second resistor are respectively connected to the third end of the resistance control unit, and a third pin of the second switch is connected to the second end of the resistance control unit.

Furthermore, the at least one resistance control unit is combined to a first series-connection control assembly and a second series-connection control assembly. The first series-connection control assembly and the second series-connection control assembly are connected in parallel.

As shown in FIG. 4, the resistance-adjustment circuit 403 comprises six resistance control units. The first series-connection control assembly and the second series-connection control assembly respectively comprise three resistance control units. The first series-connection control assembly and the second series-connection control assembly are respectively connected to the first and third pins of the first switch, and the second pin of the switch of each resistance control unit is connected to a control terminal of the control circuit 402. When the switch of one of the resistance control units is at the turn-on condition according to the voltage control signal outputted from the control circuit 402, the resistor of the resistance control unit is shorted. For example: when the first switch Q7 is at the turn-on condition according to the voltage control signal outputted from the control circuit 402, if the switches of each resistance control unit are at the turn-on condition, the resistance of the resistance-adjustment circuit 403 is the resistance of the resistor R1, and if the switches of each resistance control unit are at the turn-off condition, the resistance of the resistance-adjustment circuit 403 is a parallel resistance of R1+(R2+R4+R6) and (R3+R5+R7). If Q1 is at the turn-on condition, the resistor R2 is shorted and the resistance of the resistance-adjustment circuit 403 is a parallel resistance of R1+(R4+R6) and (R3+R5+R7). Therefore, by a control of turning on or off each switch of the at least one resistance control unit, the resistance of the resistance-adjustment circuit 403 can be adjusted.

The pulse generating circuit 404 is connected to the resistance-adjustment circuit 403 and outputs the PWM pulse modulation signal according to the adjusted driving frequency.

It should be noted that when the load connected to the two ends of the resistor R8 is detected, a current is generated to flow through the resistor R8 and a voltage drop is formed between the two ends of the resistor R8. If the voltage drop is not greater than a preset voltage, the mode detection signal outputted from the subtracter is the low voltage level. If the voltage drop is greater than the preset voltage, the mode detection signal outputted from the subtracter is the high voltage level. After the control circuit 402 received the high voltage level, the control circuit 402 starts to output the voltage control signal. The voltage control signal can control the switch to turn on to adjust the resistance of the resistance-adjustment circuit 403 and to further adjust the driving frequency of the pulse generating circuit. The pulse generating circuit 404 outputs the PWM pulse modulation signal according to the adjusted driving frequency to decrease the electromagnetic interference.

In the embodiment of the present invention, firstly, when the load detecting circuit detects that the load is connected to the load detecting circuit, the mode detection signal is outputted to the control circuit according to the current generated by the load. And then the control circuit outputs the voltage control signal to the resistance-adjustment circuit according to the mode detection signal. Secondary, the resistance-adjustment circuit adjusts the resistance of the driving resistor in the resistance-adjustment circuit according to the voltage control signal and further adjusts the driving frequency of the pulse generating circuit. Finally, the pulse generating circuit outputs PWM pulse modulation signal according to the adjusted driving frequency. Under the heavy loading mode, the driving frequency of the PWM pulse modulation signal is adjusted so the electromagnetic interference is decreased effectively.

It should be noted that the method of each above-mentioned embodiment is expressed by a combination of a series of actions to briefly describe. However, person who is skilled in the art should be understand that the present invention is not limited by the sequence of describing the actions. Certain steps may use other describing sequence or are executed at the same time. Secondly, the person who is skilled in the art should understand that the embodiments described in the specification are preferable embodiments, but the involved actions and modules are not necessary requirements of the present invention.

In the foregoing embodiments, the description of each embodiment has an emphasis thereof, a part of a certain embodiment, which is not described in detail, can refer to related description of other embodiment.

It is understandable in practical to the person who is skilled in the art that all or portion of the processes in the method according to the aforesaid embodiment can be accomplished with the computer program to instruct the related hardwares. The program can be stored in a readable storage medium in the computer. The storage medium can comprise: flash disk, a Read-Only Memory (ROM), a Random Access Memory (RAM), a disk or an optical disc etc.

The above-mentioned contents describe a downloading method and related equipment, system provided by the embodiments of the present in detail. The descriptions of the above embodiments is only used to assist and understand the method and the main idea of the present invention. At the same time, person who is skilled in the art can modify the particular implementing way and application field according to the idea of the present invention. Based on the foregoing description, the specification should not be construed as limiting the scope of the present invention.

What is claimed is:

1. A circuit for decreasing an electromagnetic interference of a PWM pulse modulation signal, wherein the circuit comprises a load detecting circuit, a control circuit, a resistance-adjustment circuit and a pulse generating circuit, wherein:
   the load detecting circuit is used to output a mode detection signal to the control circuit according to a current generated by a load when the load connected to the load detecting circuit is detected;
   the control circuit is connected to the load detecting circuit and outputs a voltage control signal to the resistance-adjustment circuit according to the mode detection signal;
   the resistance-adjustment circuit is connected to the control circuit, adjusts a resistance of a driving resistor of the resistance-adjustment circuit and further adjusts a driving frequency of the pulse generating circuit; and the pulse generating circuit is connected to the resistance-adjustment circuit and outputs the PWM pulse modulation signal according to the adjusted driving frequency.

2. The circuit according to claim 1, wherein the control circuit is particularly used for:
if the mode detection signal is a high voltage level, the circuit is ensured to be at a heavy loading condition and further outputs the voltage control signal to the resistance-adjustment circuit.

3. The circuit according to claim 1, wherein, the resistance-adjustment circuit comprises a first resistor, a first switch and at least one resistance control unit, wherein:
an end of the first resistor is connected to an input terminal of the pulse generating circuit, the other end of the first resistor is connected to a first end of the resistance control unit, a second end of the resistance control unit is connected to a first control terminal of the control circuit, a third end of the resistance control unit is connected to a first pin of the first switch, a second pin of the first switch is connected to a second control terminal of the control circuit, and a third pin of the first switch is connected to ground.

4. The circuit according to claim 3, wherein, the resistance control unit comprises a second switch and a second resistor, wherein:
a first pin of the second switch and an end of the second resistor are respectively connected to the first end of the resistance control unit, a second pin of the second switch and the other end of the second resistor are respectively connected to the third end of the resistance control unit, and a third pin of the second switch is connected to the second end of the resistance control unit.

5. The circuit according to claim 4, wherein, the at least one resistance control unit is combined to a first series-connection control assembly and a second series-connection control assembly, and the first series-connection control assembly and the second series-connection control assembly are connected in parallel.

6. The circuit according to claim 5, wherein, each of the first and second switches comprises a MOSFET or a transistor.

7. The circuit according to claim 4, wherein, the second switch comprises a MOSFET or a transistor.

8. The circuit according to claim 3, wherein, the first switch comprises a MOSFET or a transistor.

9. The circuit according to claim 1, wherein, the load detecting circuit comprises a third resistor and an operational amplifier, wherein:
an end of the third resistor is connected to a first input terminal of the operational amplifier, the other end of the third resistor is connected to a second input terminal of the operational amplifier, and an output terminal of the operational amplifier is connected to an input terminal of the control circuit.

10. The circuit according to claim 9, wherein, the operational amplifier is a subtracter.

* * * * *